(12) United States Patent
Kawaguchi et al.

(10) Patent No.: US 6,469,346 B1
(45) Date of Patent: Oct. 22, 2002

(54) HIGH-BREAKDOWN-VOLTAGE SEMICONDUCTOR DEVICE

(75) Inventors: Yusuke Kawaguchi, Miura-gun (JP); Akio Nakagawa, Yokohama (JP); Kozo Kinoshita, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/886,204

(22) Filed: Jun. 22, 2001

Related U.S. Application Data

(63) Continuation of application No. 09/323,552, filed on Jun. 1, 1999, now Pat. No. 6,259,136, which is a continuation of application No. 09/172,269, filed on Oct. 14, 1998, now Pat. No. 5,932,897.

(30) Foreign Application Priority Data

Oct. 15, 1997 (JP) .............................................. 9-282047

(51) Int. Cl.[7] ............................................. H01L 31/119
(52) U.S. Cl. ........................ 257/336; 257/343; 257/344; 257/195
(58) Field of Search ................................. 257/336, 344, 257/408–409, 338, 195, 343, 345, 141; 438/291, 307

(56) References Cited

U.S. PATENT DOCUMENTS

| | | | |
|---|---|---|---|
| 5,264,719 A | * 11/1993 | Beasom | 257/335 |
| 5,311,051 A | * 5/1994 | Tukizi | 257/409 |
| 5,552,623 A | 9/1996 | Nishizawa et al. | 257/345 |
| 5,686,755 A | 11/1997 | Malhi | 257/492 |
| 5,789,778 A | 8/1998 | Murai | 257/325 |
| 5,852,314 A | 12/1998 | Depetro et al. | 257/343 |
| 5,869,872 A | 2/1999 | Asai et al. | 257/360 |
| 5,981,997 A | 11/1999 | Kitamura | |

FOREIGN PATENT DOCUMENTS

JP  5-343675  12/1993

\* cited by examiner

Primary Examiner—Jasmine J B Clark
(74) Attorney, Agent, or Firm—Oblon, Spivak, McClelland, Maier & Neustadt, P.C.

(57) ABSTRACT

A high-breakdown-voltage semiconductor device has a first offset layer and a second offset layer the dosage of which is higher than that of the first offset layer. When the gate is in the ON state, the first offset layer functions as a resurf layer. When the gate is in the OFF state, part of the charge in the first offset layer is neutralized by a drain current flowing through an element having a low ON-resistance, however, the second offset layer functions as a resurf layer. When the drain current is $[Acm^{-1}]$, the amount of charge of electrons is $q[C]$, and the drift speed of carriers is $\upsilon_{drift}[cms^{-1}]$, the dosage $n_2$ of the second offset layer is given by $n_2 \geq I_D/(q\upsilon_{drift})$ $[cms^{-2}]$.

5 Claims, 4 Drawing Sheets

HIGH-BREAKDOWN-VOLTAGE SEMICONDUCTOR DEVICE

BACKGROUND OF THE INVENTION

The present invention relates to a high-breakdown-voltage semiconductor device.

In general, a high-breakdown-voltage semiconductor device used in a high voltage driving circuit or the like and a low-breakdown-voltage semiconductor device used in a low voltage driving circuit or the like are formed on the same substrate, constituting a power IC. Such a kind of power IC is known widely and used in various applications. Generally, at the output stage of the power IC, a high-breakdown-voltage MOSFET is used as a high-breakdown-voltage semiconductor device. The high-breakdown-voltage MOSFET requires a low ON-resistance.

FIG. 1 is a cross-sectional view of an element structure of the high-breakdown-voltage MOSFET. In the high-breakdown-voltage MOSFET, a p-type body layer 2 is selectively formed on a surface of a p-type semiconductor substrate 1 having a high resistance. An n-type source layer 3 is selectively formed in a surface of the p-type body layer 2.

An n-type offset layer 4 having a high resistance is formed in that region of the surface of the p-type semiconductor substrate 1 which differs from the region of the surface thereof in which the p-type body layer 2 is formed. A gate electrode 8 is formed on that region of the p-type body 2 which is located between the n-type source layer 3 and the n-type offset layer 4, and that region of the offset layer 4 which is adjacent to the above region of the p-type body 2, with a gate insulating film 6 and a field oxide film 7 interposed between the gate electrode 8 and the above regions of the p-type body 2 and offcet layer 4.

In the high-breakdown-voltage MOSFET, an n-type drain layer 5 is formed in a surface of an offset layer 4, and thus the offset layer 4 serves as a so-called resurf (reduced surface field) layer. The resurf layer can keep the breakdown voltage of the semiconductor device at a high value, and at the same time, restrict the ON-resistance to a low value. FIG. 2 shows drain voltage/drain current characteristic curves in relation to gate voltages $V_G$ of 0V (OFF state) to 5V with respect to the high-breakdown-voltage MOSFET.

As seen from FIG. 2, the high-breakdown-voltage MOSFET having the above structure can achieve a high breakdown voltage when the gate voltage $V_G$ is low, i.e., it is about 1V or less, and the gate is in the OFF state. However, it cannot achieve a high breakdown voltage when the gate voltage $V_G$ is more than 1V, and the gate is in the ON state.

To be more specific, in the above high-breakdown-voltage MOSFET, equipotential lines are present at a high density on the drain side in the surface of the n-type offset layer 4, and an electric field in that end portion of the n-type drain layer 5 which is opposite to the source layer 3 has a high intensity, due to a drain current flowing through the element when the gate is in the ON state. In other words, part of the positive space charge of the n-type offset layer 4 is neutralized by the charge of electrons moving through the n-type offset layer 4. Consequently, the n-type layer 4 does not act as the resurf layer, lowering the breakdown voltage. This problem becomes more remarkable when the gate voltage $V_G$ is 3V or more which is ½ or more of the rated gate voltage.

In such a manner, the breakdown voltage of the above high-breakdown-voltage MOSFET is low when the gate is in the ON state. Thus, the high-breakdown-voltage MOSFET cannot be used in an analog circuit in which the drain is directly connected to a power source, and the gate is biased.

When a drain current $I_D$ per 1 cm of a channel width is $I_D$, the amount of charge of electrons is q (=$1.6 \times 10^{-19}$C: coulomb), and the drift speed of electrons is $v_{drift}$ (=$8 \times 10^6$ cm/s), the negative charge of the n-type offset layer 4 is $I_D/(q \cdot v_{drift})$cm$^{-2}$. In addition, the gate width is a length of the gate which is measured in a direction perpendicular to the cross section of the element structure of the conventional high-breakdown-voltage MOSFET which is shown in FIG. 1. Hereinafter, it is referred to as a channel width.

BRIEF SUMMARY OF THE INVENTION

The object of the present invention is to provide a high-breakdown-voltage semiconductor device which can achieve a high breakdown voltage, both when the gate is in the ON state, and when it is in the OFF state.

The first subject matter of the present invention resides in that an offset layer is formed to have a two-layer structure, i.e., it is divided into a first offset layer and a second offset layer the dosage of which is higher than that of the first offset layer, such that the first offset layer is closer to the source side than the second offset layer, and the second offset layer is closer to the drain side than the first offset layer.

The second subject matter of the present invention having the above structure resides in that, even if part of the charge of the first offset layer extending to the source side is neutralized by a drain current which flows through an element having a low resistance when the gate is in the ON state, the charge of the second offset layer closer to the drain side than the first offset layer is made to remain, and the second offset layer is made to serve as a resurf layer. By virtue of these features, the entire element achieves a low ON resistance and, simultaneously, a high breakdown voltage, both when it is in the ON state and when it is in the OFF state.

In order to attain the above object, a high-breakdown-voltage semiconductor device according to the first aspect of the present invention comprises:

a semiconductor substrate;

a body layer of a first conductivity type selectively formed on a region of a surface of the semiconductor substrate;

a source layer of a second conductivity type selectively formed in a surface of the body layer;

a first offset layer of the second conductivity type selectively formed on a region of the surface of the semiconductor substrate which differs from the region of the surface of the semiconductor substrate on which the body layer is formed;

a second offset layer of the second conductivity type formed on at least a surface region of the first offset layer;

a drain layer of the second conductivity type selectively formed in a surface of the second offset layer;

a source electrode formed to contact a surface of the body layer and a surface of the source layer;

a drain electrode formed on a surface of the drain layer;

an insulating film formed on a region of the semiconductor substrate which is located between the source electrode and the drain electrode; and a gate electrode formed on at least that region of the body layer which is located between the source layer and the first offset layer, with the insulating film interposed between the gate electrode and the region of the body layer, wherein when mobility of carriers in a channel of an element is $\mu[\text{cm}^2\,\text{V}^{-1}\,\text{s}^{-1}]$, a dielectric constant of the gate insulating film is $\epsilon[\text{F cm}^{-1}]$, a thickness of the gate insulating film is $d[\text{cm}]$, a channel length is $L[\text{cm}]$, a threshold voltage is $V_T[\text{V}]$, and a rated gate voltage is $V_G[\text{V}]$, a drain current $I_D$ per 1 cm of a channel width is given by:

$$I_D = (\mu \cdot \epsilon) \cdot (V_G/2 - V_T)/(4\,Ld)$$

and when an amount of charge electrons is $q[\text{C}]$, and a drift speed of carriers is $\upsilon^{drift}[\text{cm s}^{-1}]$, a dosage $n_2$ of the second offset layer is expressed by the following formula:

$$n_2 \geq I_D/(q \cdot \upsilon_{drift})[\text{cm}^{-2}].$$

In the above high-breakdown-voltage semiconductor device, the impurity concentration of the second offset layer is higher than the impurity concentration of the first offset layer.

A high-breakdown-voltage semiconductor device according to the second aspect of the present invention comprises:

a semiconductor substrate;

a body layer of a first conductivity type selectively formed on a region of a surface of the semiconductor substrate;

a source layer of a second conductivity type selectively formed in a surface of the body layer;

a first offset layer of the second conductivity type selectively formed on a region of the surface of the semiconductor substrate which differs from the region of the surface of the semiconductor substrate on which the body layer is formed;

a second offset layer of the second conductivity type formed on at least a surface portion of the first offset layer;

a drain layer of the second conductivity type selectively formed in a surface of the second offset layer;

a source electrode formed to contact a surface of the body layer and a surface of the source layer;

a drain electrode formed on a surface of the drain layer;

an insulating film formed on a region of the semiconductor substrate which is located between the source electrode and the drain electrode; and a gate electrode formed on a region of the body layer which is located between the source layer and the first offset layer, with the insulating film interposed between the gate electrode and the region of the body layer, wherein when a dosage of the first offset layer is $n_1$, and a dosage of the second offset layer is $n_2$, the following relationship is satisfied: $2n_1 \leq n_2 \leq 4n_1$.

It is preferable that the above dosage $n_1$ be $1.5 \times 10^{12}\,\text{cm}^{-2}$ or more and $4 \times 10^{12}\,\text{cm}^{-2}$ or less.

A high-breakdown-voltage semiconductor device according to the third aspect comprises:

a semiconductor substrate;

a body layer of a first conductivity type selectively formed on a region of a surface of the semiconductor substrate;

a source layer of a second conductivity type selectively formed in a surface of the body layer;

a first offset layer of the second conductivity type selectively formed on a region of the surface of the semiconductor substrate which differs from the region of the surface of the semiconductor substrate on which the body layer is formed;

a second offset layer of the second conductivity type formed on at least a surface portion of the first offset layer;

a drain layer of the second conductivity type selectively formed in a surface of the second offset layer;

a source electrode formed to contact a surface of the body layer and a surface of the source layer;

a drain electrode formed on a surface of the drain layer;

an insulating film formed on a region of the semiconductor substrate which is located between the source electrode and the drain electrode; and a gate electrode formed on a region of the body layer which is located between the source layer and the first offset layer, with the insulating film interposed between the gate electrode and the region of the body layer, wherein:

the breakdown voltage of the semiconductor device is determined by a state of a depletion layer which is formed in the first offset layer when a reverse voltage is applied between the drain layer and the body layer, and a voltage of 0V is applied to the gate electrode; and the breakdown voltage of the semiconductor device is determined by the state of a depletion layer which is formed in the second offset layer when a reverse voltage is applied between the second offset layer and the body layer, and a gate voltage having the same polarity as a drain voltage to be applied to the drain electrode is applied to the gate electrode.

In the high-breakdown-voltage semiconductor device according to the third aspect, the impurity concentration of the second offset layer is higher than an impurity concentration of the first offset layer.

According to the first to third aspect, the second offset layer contains carriers at a density corresponding to an impurity concentration of the second offset layer, even when a reverse voltage is applied between the second offset layer and the body layer, and a voltage of 0V is applied to the gate electrode.

It is preferable that the semiconductor substrate is of the second conductivity type.

However, the semiconductor substrate may be of the first conductivity type, and its impurity concentration may be lower than the impurity concentration of the first offset layer.

It is preferable that the gate electrode extend over at least a part of the surface of the first offset layer, and a thickness of a region of the insulating film which is located between the gate electrode and an end portion of the second offset layer be greater than a thickness of a region of the insulating film which is located between the gate electrode and an end portion of the first offset layer.

Note that the gate electrode may extend over a part of the surface of the second offset layer.

To summarize, in the present invention, when the gate is in the OFF state, the first offset layer functions as a resurf layer as in a conventional high-breakdown-voltage MOSFET. When the gate is in the ON state, part of the charge in the first offset layer is neutralized by a drain current flowing through the element having a low ON-resistance; however, the second offset layer the dosage $n_2$ of which is higher than the dosage $n_1$ of the first offset layer functions as a resurf layer. By virtue of this feature, a low ON-resistance can be achieved and, at the same time, a high breakdown voltage can be achieved, both when the gate is in the ON state and when it is in the OFF state.

According to the first aspect, the above advantageous effect can be obtained easily and reliably since the formula "$n_2 \geq I_D/(q \cdot \upsilon_{drift})[\text{cm}^{-2}]$" is satisfied as mentioned above. According the second aspect, the effect can be obtained more easily and reliably since the formula "$2n_1 \leq n_2 \leq 4n_1$" is satisfied.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiments of the present invention will be explained with reference to the accompanying drawings.
(First Embodiment)

Figure 1:
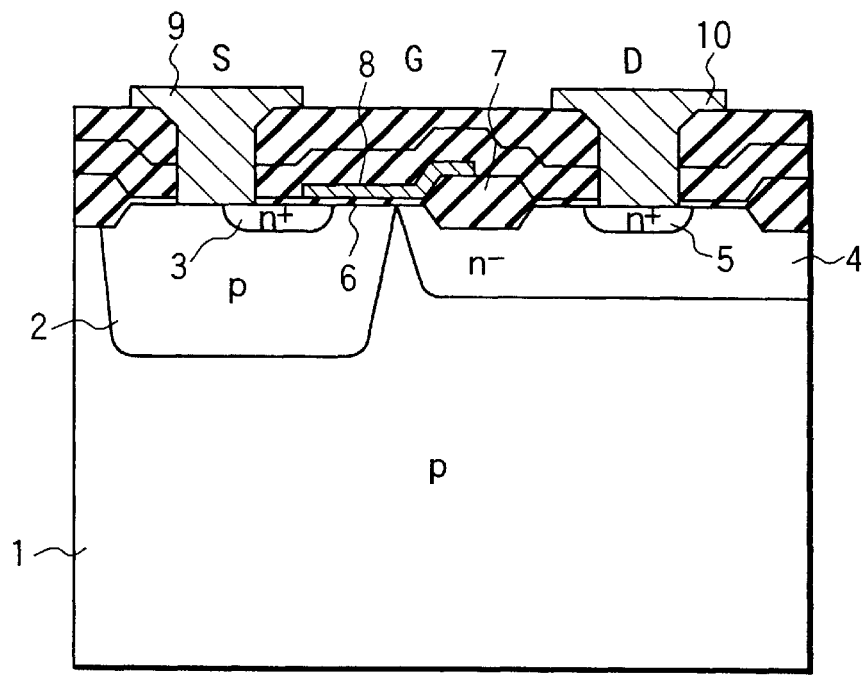
FIG. 1 is a cross-sectional view of an element structure of a conventional high-breakdown-voltage MOSFET.
Figure 2:
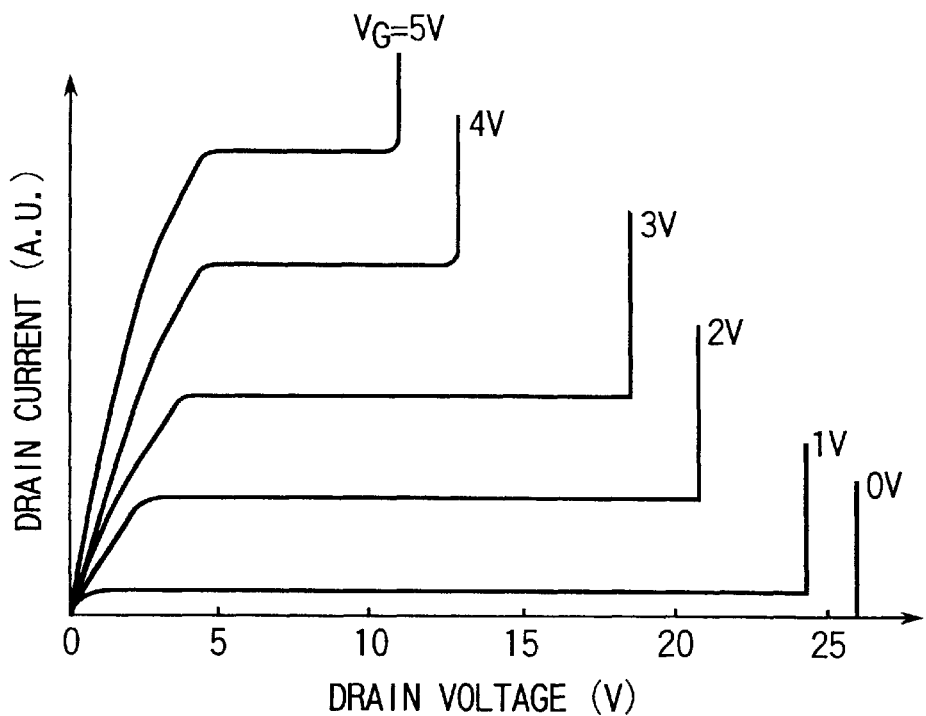
FIG. 2 is a view showing drain voltage/drain current characteristic curves of the conventional high-breakdown-voltage MOSFET.
Figure 3:
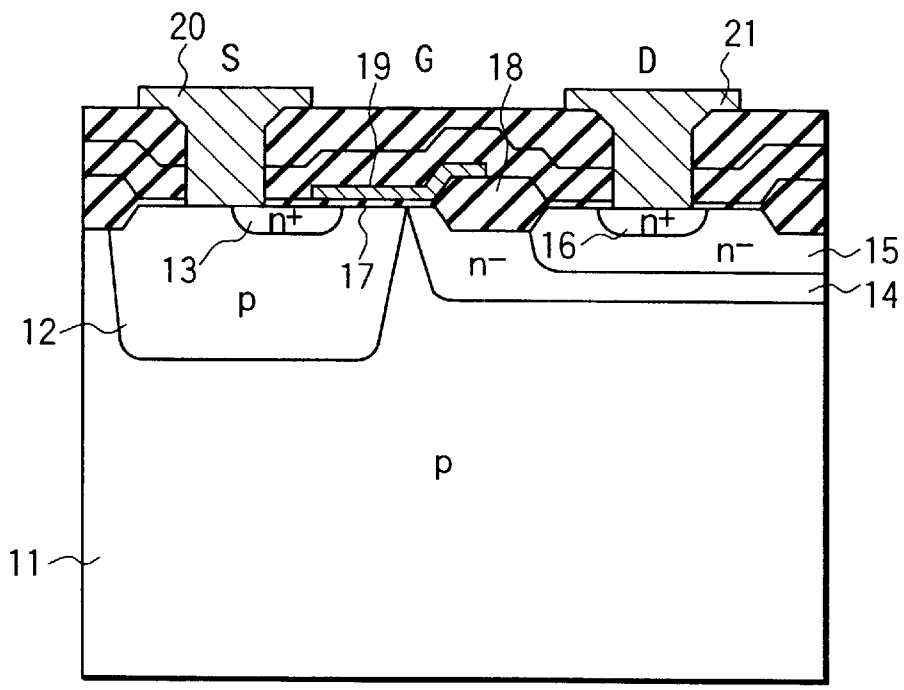
FIG. 3 is a cross-sectional view of an element structure of a high-breakdown-voltage MOSFET according to the first embodiment of the present invention.

FIG. 3 is a cross-sectional view of an element structure of a high-breakdown-voltage MOSFET according to the first embodiment of the present invention. In the high-breakdown-voltage MOSFET, a p-type body layer 12 is selectively formed on a surface of a p-type semiconductor substrate 11 having a high resistance, and an n-type source layer 13 having a low resistance is selectively formed on a surface of the p-type body layer 12.

A first n-type offset layer 14 having a high resistance is formed on that region of the surface of the p-type semiconductor substrate 11 which differs from the region thereof on which the p-type body layer 12 is formed. A second n-type offset layer 15 having a lower resistance (higher dosage) than the first n-type offset layer is formed on an inner surface portion of the first n-type offset layer 14.

An n-type drain layer 16 having a lower resistance than the second n-type offset layer 15 is selectively formed on a surface of the second offset layer 15. A gate electrode 19 is formed on that portion of the surface of the p-type body layer 12 which is located between the n-type source layer 13 and the first n-type offset layer 14, and on that surface portion of the first n-type offset layer 14 which is continuous with the above portion of the surface of the p-type body layer 12, with a gate insulating film 17 and a field oxide film 18 interposed between the gate electrode and the portion of the surface of the p-type body layer 12 and the surface portion of the first n-type offset layer 14.

A source electrode 20 is formed to contact the ntype source layer 13 and the p-type body layer 12. A drain electrode 21 is formed on the n-type drain layer 16.

The layers and electrodes shown in FIG. 3 are arranged in a stripe pattern in a direction perpendicular to the cross section of the element which is shown in FIG. 3. In addition, a plurality of elements each having the stripe-form element structure shown in FIG. 3 are formed in parallel with each other, constituting a high-break-down semiconductor device.

When the mobility of carriers in a channel of the element is $\mu[\text{cm}^2/\text{V·s}]$, the dielectric constant of the gate insulating film 17 is $\epsilon[\text{F/cm}]$, the thickness of the gate insulating film 17 is $d[\text{cm}]$, the channel length is $L[\text{cm}]$, the threshold voltage is $V_T [V]$, and the rated gate voltage is $V_G [V]$, a drain current $I_D$ per 1 cm of a channel width is expressed by the following equation (1):

$$I_D = (\mu \cdot \epsilon) \cdot (V_G/2 - V_T)/(4\,Ld)[A/cm] \quad (1)$$

In this case, when the dosage of the second n-type offset layer 15 is $n_2$, the charge amount of electrons is $q[=1.6 \times 10^{-19}\,C]$, and the drift speed of electrons is $v_{drift}\,[=8 \times 10^6\,\text{cm/s}]$, the dosage $n_2$ of the second n-type offset layer 15 is set to satisfy the following relationship (2) with the charge amount $q[C]$ of electrons and the drift speed $v_{drift}\,[\text{cm/s}]$ thereof:

$$n_2 \geq I_D/(q \cdot v_{drift})[\text{cm}^{-2}] \quad (2)$$

In the first embodiment, $\mu=700\,[\text{cm}^2/\text{V·s}]$, $\epsilon=3.5 \times 10^{-13}$ [F/cm], $d=1.5 \times 10^{-6}$ [cm], $L=1 \times 10^{-4}$ [cm], $V_T=1[V]$, $V_G=5$ [V], and the dosage $n_2$ is $9 \times 10^{12}\,[\text{cm}^{-2}]$.

The drift speed of electrons increases as the electric field increases to be saturated to a constant value. The above mentioned $v_{drift}$ corresponds to this constant value and the value is $8 \times 10^6$ cm/s.

The operation of the high-breakdown-voltage MOSFET having the above structure will be explained.

Figure 4:
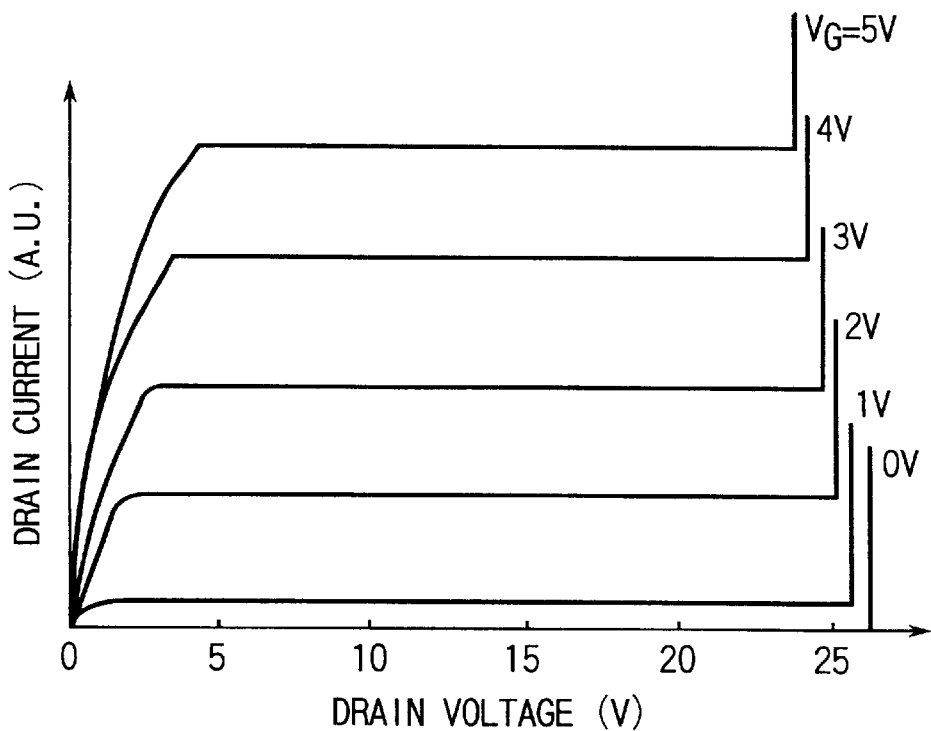
FIG. 4 is a view showing drain voltage/drain current characteristic curves of the high-breakdown-voltage MOSFET according to the first embodiment.

In the high-breakdown-voltage MOSFET, the first ntype offset layer 14 function as a resurf layer as in the conventional high-breakdown-voltage MOSFET, and the breakdown voltage is set at a high value as shown in FIG. 4. At this time, the dosage of the second n-type resurf layer 15 is set such that the second n-type resurf layer 15 is not completely depleted.

On the other hand, when the gate is in the ON state (the gate voltage $V_G$=5V), a high-break-down voltage can be achieved as shown in FIG. 4, although part of the charge of the first n-type offset layer 14 is neutralized by the drain current flowing through the element. This is because the second n-type offset layer 15, the dosage of which is higher than that of the first n-type offset layer 14, serves as a resurf layer. Furthermore, a low ON-resistance can be obtained, in addition to the achievement of a high-breakdown voltage which has no relation to whether the gate is in the ON state or in the OFF state.

In such a manner, according to the first embodiment, a low ON-resistance can be obtained, and simultaneously a high-breakdown-voltage can be achieved when the gate voltage is in the range of 0V to 5V.

Figure 5:
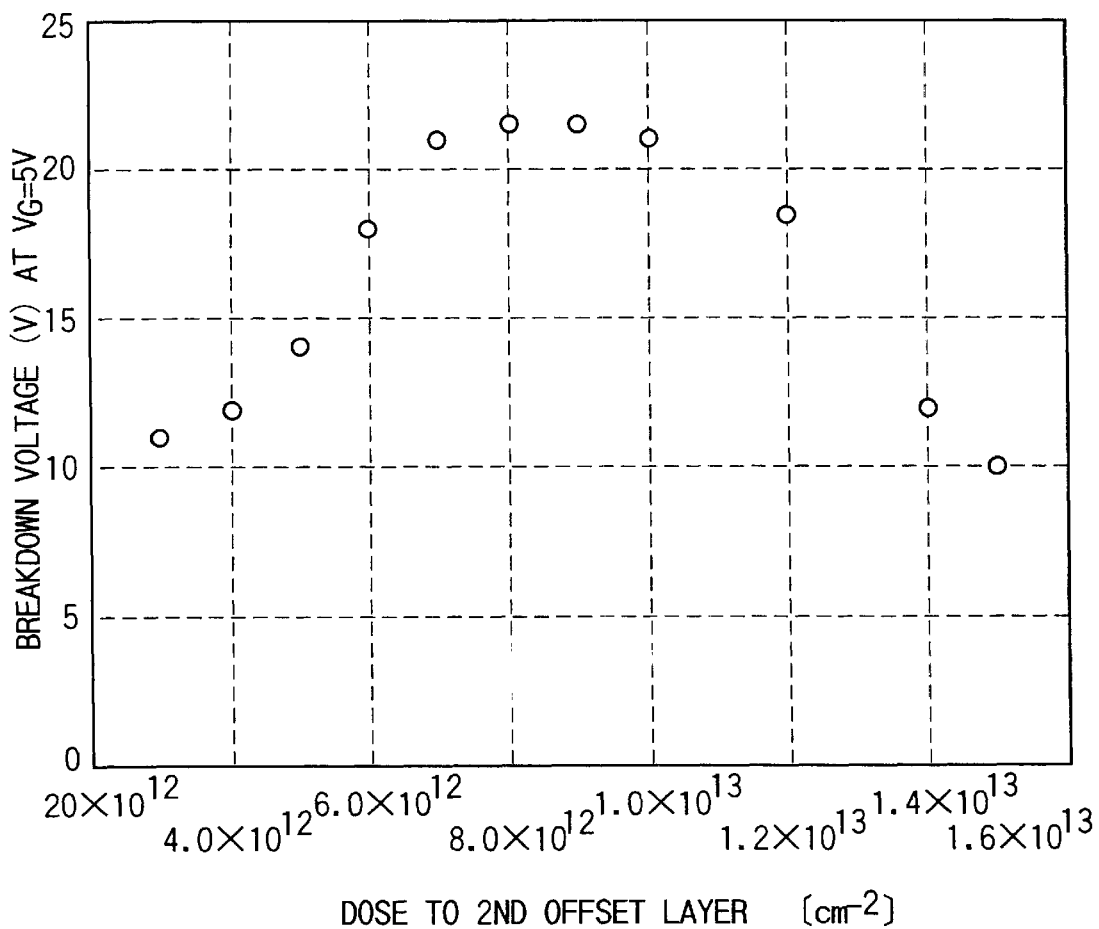
FIG. 5 is a view showing that relationship between an element break-down-voltage and a dosage of a second n-type offset layer in the first embodiment, which is established when a gate is in the ON state.

FIG. 5 is a view showing that relationship between the dosage $n_2$ of the second n-type offset layer 15 and the breakdown voltage of the element, which is established when the gate is in the ON state. In this case, the dosage $n_1$ of the first n-type offset layer 14 is $3 \times 10^{12}\,[\text{cm}^{-2}]$. As is seen from FIG. 5, the breakdown voltage greatly increases when the dosage $n_2$ falls within $6 \times 10^{12}\,[\text{cm}^{-2}]$ to $1.2 \times 10^{13}\,[\text{cm}^{-2}]$.

Therefore, it is preferable that the dosage $n_2$ satisfy the following relationship: $2n_1 \leq n_2 \leq 4n_1$. This is because if $n_2$ is smaller than $2n_1$ ($n_2<2n_1$), part of the charge is neutralized by the drain current. On the other hand, if $n_2$ is great than $4n_1$ ($4n_1<n_2$), the second n-type offset layer 15 is not completely depleted, nor does it serve as a resurf layer or function to achieve a high breakdown voltage.

Furthermore, the same result as in FIG. 5 can be obtained, and the relationship $2n_1 \leq n_2 \leq 4n_1$ is satisfied, when the dosage $n_1$ of the first n-type offset layer 14 falls within 1.5 to $4\times10^{12}$ [cm$^{-2}$]. In this case, $n_2$ is within $3\times10^{12}$ to $1.6\times10^{13}$ [cm$^{-2}$].

As stated above, according to the first embodiment, when the gate is in the OFF state, the first n-type offset layer 14 functions as a resurf layer, thus achieving a high breakdown voltage, as in the conventional high-breakdown-voltage MOSFET. When the gate is in the ON state, a low ON-resistance can be obtained, and at the same time, a high breakdown voltage can be achieved regardless of whether the gate is in the ON state or in the OFF state, although part of the charge in the first n-type offset layer 14 is neutralized by the drain current $I_D$ flowing through the element the ON-resistance of which is low. This is because the second n-type offset layer 15, the dosage $n_2$ of which is higher than the dosage $n_1$ of the first n-type offset layer 14, functions as a resurf layer.

The above advantageous effect can be obtained easily and reliably since the dosage $n_2$ is determined to satisfy the following condition (the above relationship (2)): $n_2 \geq I_D/(q \cdot v_{drift})$[cm$^{-2}$]. In this case, it is preferable that the dosage. be also optimized by the value of a drain current $I_D$ to be used.

Furthermore, the above effect can be obtained more easily and reliably if the dosage $n_1$ of the first n-type offset layer 14 is set to fall within 1.5 to $4\times10^{12}$ [cm$^{-2}$], and the dosage $n_2$ of the second n-type offset layer 15 is set to satisfy the relationship $2n_1 \leq n_2 \leq 4n_1$.

Figure 6:
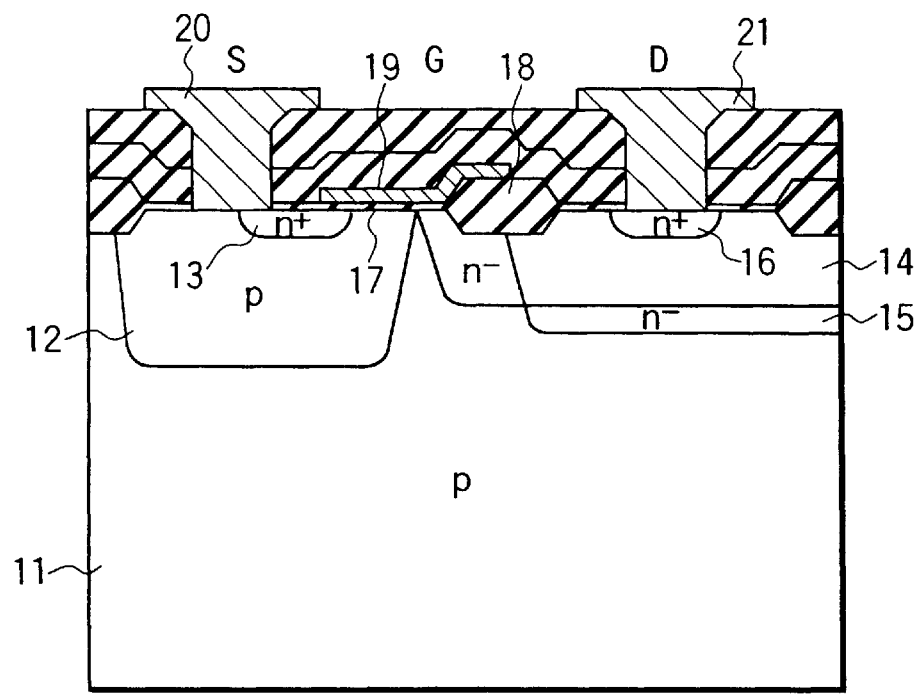
FIG. 6 is a cross-sectional view of an element structure of a high-breakdown-voltage MOSFET according to a modification of the first embodiment of the present invention.

In the first embodiment, the second n-type offset layer 15 is formed on the inner surface of the first n-type offset layer 14. However, as shown in FIG. 6, the thickness of the second n-type offset layer 15 may be increased such that the lower surface thereof is located deeper than the first n-type offset layer 14, if the following condition is satisfied: in the surface of the p-type semiconductor substrate 1, the first n-type offset layer 14 is provided adjacent to the p-type body layer 12, and the second n-type offset layer 15 is located further from the p-type body layer 12 than that end portion of the first n-type offset layer 14 which is adjacent to the p-type body layer 12.

In addition, it is desirable that an insulating film 18 at the position where the end portion of the second n-type offset layer 15 is opposite to the gate electrode 19 is greater in thickness than the gate insulating film 17 at the position where the end portion of the first n-type offset layer 14 is opposite to the gate electrode 19. Further, it is preferable that the end portion of the gate electrode on the drain side extends over the thick insulation film 18. In the above explanation for the first embodiment, the insulating film 18 is referred to as the field oxide film 18, which is greater in thickness than the gate insulating film 17. This structure can relax the electric field strength between the second n-type offset layer 15 and the gate electrode 19, thereby to prevent a leakage current from flowing therebetween.

(Second Embodiment)

Figure 7:
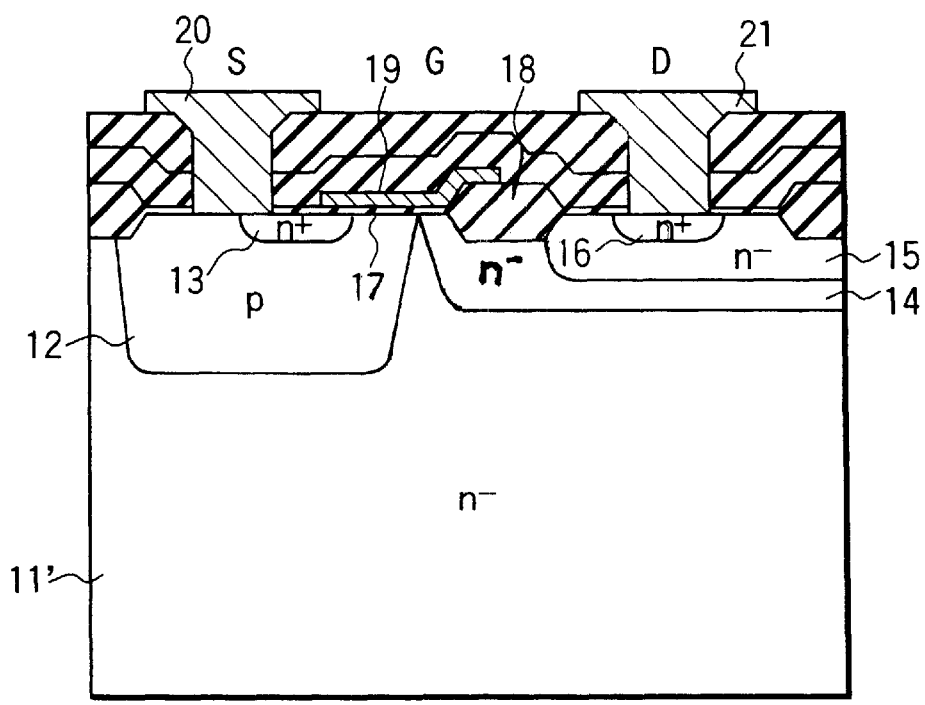
FIG. 7 is a cross-sectional view of an element structure of a high-breakdown-voltage MOSFET according to the second embodiment of the present invention.

FIG. 7 is a cross-sectional view of a high-breakdown-voltage semiconductor device according to the second embodiment of the present invention. With respect to the second embodiment, structural elements identical to those in the first embodiment will be denoted by the same reference numerals, and explanation of those structural elements will be omitted.

The second embodiment differs from the first embodiment in the following point: the semiconductor device according to the second embodiment has a semiconductor substrate 11' which is of an n$^-$-type. In this case, the semiconductor substrate 11' needs to have a higher resistance than the first n-type offset layer 14 to prevent a current from flowing through the substrate 11'. As a result, the same effect can be obtained as in the first embodiment.

Furthermore, with respect to the first and second embodiments, the above explanations are made on the premise that the first conductivity type is a p-type and the second conductivity type is an n-type. However, the first and second embodiments are not limited to this. The first conductivity type and the second conductivity type may be an n-type and a p-type, respectively.

As explained above, according to the present invention, a high-breakdown-voltage semiconductor device can be provided which can obtain a low ON-resistance and, simultaneously achieve a high breakdown voltage, both when the gate is in the ON state and when it is the OFF state.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A high-breakdown-voltage semiconductor device comprising:

a semiconductor substrate;

a body layer of a first conductivity type selectively formed on a region of a surface of the semiconductor substrate;

a source layer of a second conductivity type selectively formed in a surface of the body layer;

a drain layer of the second conductivity type selectively formed on the surface of the semiconductor substrate apart from the body layer;

a second layer of the second conductivity type formed on the surface of the substrate between the body layer and the drain layer, the second layer being apart from the body layer;

a source electrode formed to contact a surface of the body layer and a surface of the source layer; and a gate electrode formed on at least a region of the body layer located between the source layer and the drain layer, the gate electrode being apart from the drain layer and the second layer, with an insulating film interposed between the gate electrode and the region of the body layer;

wherein, under conditions that a voltage is applied between the drain layer and the body layer, and a gate voltage having the same polarity as a drain voltage to be applied to the drain layer, within a rated gate voltage range, the rated gate voltage being a gate voltage range applicable to the gate electrode in a normal operation, and over a threshold voltage of the semiconductor device, is applied to the gate electrode, a breakdown voltage between the drain layer and the body layer is larger than a half of a breakdown voltage between the drain layer and the body layer with the gate voltage set at 0 volts.

2. The high-breakdown voltage semiconductor device according to claim 1, wherein, under conditions that the voltage is applied between the drain layer and the body layer, and the gate voltage having the same polarity as the drain voltage to be applied to the drain layer, within the rated gate voltage range and over the threshold voltage of the semiconductor device, is applied to the gate electrode, the breakdown voltage between the drain layer and the body layer is larger than 80% of the breakdown voltage between the drain layer and the body layer with the gate voltage set at 0 volts.

3. The high-breakdown voltage semiconductor device according to claim 1, wherein, under conditions that the voltage is applied between the drain layer and the body layer, and the gate voltage having the same polarity as the drain voltage to be applied to the drain layer, within the rated gate voltage range and over the threshold voltage of the semiconductor device, is applied to the gate electrode, the breakdown voltage between the drain layer and the body layer is larger than a rated voltage of the breakdown voltage between the drain layer and the body layer with the gate voltage set at 0 volts.

4. The high-breakdown voltage semiconductor device according to claim 1, wherein the semiconductor substrate is of the second conductivity type.

5. The high-breakdown voltage semiconductor device according to claim 1, when the semiconductor substrate is of the first conductivity type, further comprising a first layer of the second conductivity type on the surface of the substrate between the body layer and the second layer, and contacting the second layer, an impurity concentration of the first layer being lower than that of the second layer.

* * * * *